(12) United States Patent
Colvin et al.

(10) Patent No.: US 9,543,110 B2
(45) Date of Patent: Jan. 10, 2017

(54) REDUCED TRACE METALS CONTAMINATION ION SOURCE FOR AN ION IMPLANTATION SYSTEM

(71) Applicant: Axcelis Technologies, Inc., Beverly, MA (US)

(72) Inventors: Neil Colvin, Merrimack, NH (US); Tseh-Jen Hsieh, Rowley, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 12 days.

(21) Appl. No.: 14/135,754

(22) Filed: Dec. 20, 2013

(65) Prior Publication Data
US 2015/0179393 A1 Jun. 25, 2015

(51) Int. Cl.
*H01J 27/20* (2006.01)
*H01J 37/08* (2006.01)
*H01J 37/317* (2006.01)

(52) U.S. Cl.
CPC ............ *H01J 37/08* (2013.01); *H01J 37/3171* (2013.01); *H01J 2237/0213* (2013.01);
(Continued)

(58) Field of Classification Search
CPC .......... H01J 27/00; H01J 27/02; H01J 27/022; H01J 27/024; H01J 27/20; H01J 27/205; H01J 27/22; H01J 37/08; H01J 37/3171; H01J 2237/0213; H01J 2237/082; H01J 2237/0268; H01J 2237/31705
(Continued)

(56) References Cited

U.S. PATENT DOCUMENTS 4,346,049 A * 8/1982 Coppola ............... C04B 35/565
264/29.5
5,026,997 A 6/1991 Benveniste
(Continued)

FOREIGN PATENT DOCUMENTS

EP 1220271 A2 7/2001
EP 1675154 A2 6/2006

OTHER PUBLICATIONS

Hexoloy SG Silicon Carbide: "Hexology Silicon Carbide Materials", Publication Data-20021201 Saint-Gobain Ceramics; http://www.hexoloy.com/data-sheets/silicon-carbide-products/pdf/b-1001.pdf; retrieved May 11, 2016; 3 pages.

*Primary Examiner* — David E Smith
(74) *Attorney, Agent, or Firm* — Cantor Colburn LLP (57) ABSTRACT

An ion source chamber for ion implantation system includes a housing that at least partially bounds an ionization region through which high energy electrons move from a cathode to ionize gas molecules injected into an interior of the housing; a liner section defining one or more interior walls of the housing interior, wherein each liner section includes a interiorly facing surface exposed to the ionization region during operation the ion implantation system; a cathode shield disposed about the cathode; a repeller spaced apart from the cathode; a plate including a source aperture for discharging ions from the ion source chamber; wherein at least one of the repeller, the liner section, the cathode shield; the plate, or an insert in the plate defining the source aperture comprise silicon carbide, wherein the silicon carbide is a non-stoichiometric sintered material having excess carbon.

9 Claims, 3 Drawing Sheets

(52) U.S. Cl.
CPC . *H01J 2237/0268* (2013.01); *H01J 2237/082* (2013.01); *H01J 2237/31705* (2013.01)

(58) Field of Classification Search
USPC .............................................. 250/424–423 F
See application file for complete search history.

(56) References Cited

U.S. PATENT DOCUMENTS

| | | |
|---|---|---|
| 5,436,790 A | 7/1995 | Blake et al. |
| 5,444,597 A | 8/1995 | Blake et al. |
| 5,497,006 A | 3/1996 | Sferlazzo et al. |
| 5,517,077 A | 5/1996 | Bright et al. |
| 5,594,963 A | 1/1997 | Berkowitz |
| 5,703,372 A | 12/1997 | Horsky et al. |
| 5,763,890 A * | 6/1998 | Cloutier ................. H01J 27/08 250/423 R |
| 5,892,236 A * | 4/1999 | Takahashi et al. ...... 250/492.21 |
| 5,944,963 A * | 8/1999 | Ruppel ................. C04B 35/565 204/192.15 |
| 5,977,552 A | 11/1999 | Foad |
| 6,583,544 B1 * | 6/2003 | Horsky ................... H01J 27/12 250/492.2 |
| 6,768,121 B2 | 7/2004 | Horskey et al. |
| 7,655,930 B2 | 2/2010 | Huang et al. |
| 2003/0230986 A1* | 12/2003 | Horsky ................... C23C 14/48 315/111.81 |
| 2006/0097645 A1* | 5/2006 | Horsky ................... C23C 14/48 315/111.81 |
| 2008/0067412 A1 | 3/2008 | Vanderberg et al. |
| 2008/0087219 A1 | 4/2008 | Horsky |
| 2012/0286152 A1* | 11/2012 | Jones et al. .................... 250/282 |
| 2015/0090897 A1* | 4/2015 | Mason ..................... H01J 37/08 250/423 R |

* cited by examiner

REDUCED TRACE METALS CONTAMINATION ION SOURCE FOR AN ION IMPLANTATION SYSTEM

BACKGROUND

The present disclosure generally relates to ion implantation systems, and more particularly, to a reduced trace metal contamination ion source of the type typically used in ion implantation systems, which exhibits improved corrosion resistance within the arc chamber of the ion source.

Ion implantation systems or ion implanters are widely used to dope semiconductors with impurities in integrated circuit manufacturing, as well as in the manufacture of flat panel displays. In such systems, an ion source ionizes a desired dopant element, which is extracted from the source in the form of an ion beam of desired energy. The ion beam is then directed at the surface of the workpiece, such as a semiconductor wafer, in order to implant the workpiece with the dopant element. The ions of the beam penetrate the surface of the workpiece to form a region of desired conductivity, such as in the fabrication of transistor devices in the wafer. The implantation process is typically performed in a high vacuum process chamber, which prevents dispersion of the ion beam by collisions with residual gas molecules and minimizes the risk of contamination of the workpiece by airborne particles. A typical ion implanter includes an ion source for generating the ion beam, a beamline including a mass analysis magnet for mass resolving the ion beam, and a target chamber containing the semiconductor wafer or other substrate or workpiece to be implanted by the ion beam, although flat panel display implanters typically do not include a mass analysis apparatus. For high energy implantation systems, an acceleration apparatus may be provided between the mass analysis magnet and the target chamber for accelerating the ions to high energies.

Conventional ion sources include a plasma confinement chamber having an inlet aperture for introducing a gas to be ionized into plasma and an exit aperture opening through which the plasma is extracted to form the ion beam. One example of a dopant gas is phosphine. When phosphine is exposed to an energy source, such as energetic electrons or radio frequency (RF) energy, the phosphine can disassociate to form positively charged phosphorous ($P^+$) ions for doping the workpiece, as well as disassociated hydrogen ions. Typically, phosphine is introduced into the plasma confinement chamber and then exposed to the electron source to produce both phosphorous ions and hydrogen ions. The plasma comprises ions desirable for implantation into a workpiece, as well as undesirable ions which are a by-product of the dissociation and ionization processes. The phosphorous ions and the hydrogen ions are then extracted through the exit opening into the ion beam using an extraction apparatus including energized extraction electrodes. Examples of other typical dopant elements of which the source gas is comprised include phosphorous (P), arsenic (As), or Boron (B), and many others.

The dosage and energy of the implanted ions are varied according to the implantation desired for a given application. Ion dosage controls the concentration of implanted ions for a given semiconductor material. Typically, high current implanters are used for high dose implants, while medium current implanters are used for lower dosage applications. Ion energy is used to control junction depth in semiconductor devices, where the energy levels of the ions in the beam determine the degree of depth of the implanted ions. The continuing trend toward smaller and smaller semiconductor devices requires a beamline construction which serves to deliver high beam currents at low energies. The high beam current provides the necessary dosage levels, while the low energy permits shallow implants. In addition, the continuing trend toward higher device complexity requires careful control over the uniformity of implantation beams being scanned across the workpiece.

The ionization process in the ion source is achieved by excitation of electrons, which then collide with ionizable materials within the ion source chamber. This excitation has previously been accomplished using heated cathodes or RF excitation antennas. A cathode is heated so as to emit electrons which are then accelerated to sufficient energy for the ionization process, whereas an RF antenna generates electric fields that accelerate plasma electrons to sufficient energy for sustaining the ionization process. The antenna may be exposed within the plasma confinement chamber of the ion source, or may be located outside of the plasma chamber, separated by a dielectric window. The antenna is energized by an RF alternating current which induces a time varying magnetic field within the plasma confinement chamber. This magnetic field in turn induces an electric field in a region occupied by naturally occurring free electrons within the source chamber. These free electrons accelerate due to the induced electric field and collide with ionizable materials within the ion source chamber, resulting in plasma currents within the ion chamber, which are generally parallel to and opposite in direction to the electric currents in the antenna. Ions can then be extracted from the plasma chamber by one or more energizable extraction electrodes located proximate a small exit opening, so as to provide a small cross-section (relative to the size of the workpiece) ion beam.

Batch ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with coordinated wafer support movements to selectively dope or treat the entire wafer surface.

Ion sources that generate the ion beams used in existing implanters are typically so called arc ion sources and can include heated filament cathodes for creating ions that are shaped into an appropriate ion beam for wafer treatment. U.S. Pat. No. 5,497,006 to Sferlazzo et al concerns an ion source having a cathode supported by a base and positioned with respect to a gas confinement chamber for ejecting ionizing electrons into the gas confinement chamber. The cathode of the '006 patent is a tubular conductive body and endcap that partially extends into the gas confinement chamber. A filament is supported within the tubular body and emits electrons that heat the endcap through electron bombardment. The heated endcap then thermionically emits the ionizing electrons into the gas confinement chamber.

U.S. Pat. No. 5,763,890 to Cloutier et al also discloses an arc ion source for use in an ion implanter. The ion source includes a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber.

Current materials defining the ion source chamber are typically formed of refractory metals and/or graphite, wherein the more commonly used refractory metals include tungsten, molybdenum, tantalum, and the like. Corrosion of these materials can occur when ionizing fluorine-based compounds such as $BF_3$, $GeF_4$, $SiF_4$, $B_2F_4$ and/or oxygen-based compounds such as CO and $CO_2$, which can dramatically shorten the lifetimes of these materials as well as deleteriously introduce impurities during ion implantation. For example, ionization of fluorine containing compounds can produce $F^-$, which can react with exposed surfaces containing the currently employed refractory metal of tungsten, molybdenum, tantalum, graphite, and the like. For example, $MoF_x$, $WF_x$, $TaF_x$, and the like can be formed upon exposure to $F^-$ ions, wherein x is an integer of 1 to 6 in most instances. These materials are corrosive by themselves and the presence of these corrosive materials within the chamber can further propagate a halogen cycle where the deposition of these materials within the ion source chamber may occur, which significantly shortens operating lifetimes of these components. When ionizing oxygen-based compounds such as CO and $CO_2$, the formation of the corresponding refractory oxide can also cause erosion of the ion source components within the ion source chamber including but not limited to the cathode, liners, cathode shield (i.e., cathode repeller), repeller (i.e., anti-cathode), source aperture slit (i.e., ion source optics plate), and the like, thereby shortening operating lifetimes and requiring replacement.

In addition to the corrosive problems noted above that affect operating lifetimes, the refractory metal fluoride and/or refractory metal oxides that are generated upon exposure to ionized fluorine and/or oxygen species are oftentimes volatile by themselves. Unfortunately, these volatile compounds can be transported along with the desired dopant ions to the substrate being processed, which directly affects device performance and yield.

Therefore, a need exists to for improved ion source chamber components in ion implantation systems, wherein the improvement provides equivalent or better performance to the currently utilized materials such as, for example, the tungsten-, molybdenum-, and like refractory-based materials, yet are generally inert during processing so as to provide extended operating lifetimes without generating volatile compounds affecting device performance and yield.

BRIEF SUMMARY

Disclosed herein is a reduced trace metal contamination ion source for use in ion implantation systems. In one embodiment, an ion source chamber for an ion implantation system, the ion source chamber comprises a housing that at least partially bounds an ionization region through which high energy electrons move from a cathode to ionize gas molecules injected into an interior of the housing; a liner section defining one or more interior walls of the housing interior, wherein each liner section includes a interiorly facing surface exposed to the ionization region during operation the ion implantation system; a cathode shield disposed about the cathode; a repeller spaced apart from the cathode; a plate comprising a source aperture for discharging ions from the ion source chamber; wherein at least one of the repeller, the liner section, the cathode shield; the plate, or an insert in the plate defining the source aperture comprise silicon carbide, wherein the silicon carbide is a non-stoichiometric sintered material of the formula $SiC_x$, wherein x is in a range from 1.1 to 1.45.

In another embodiment, ion implantation system comprises an ion source chamber; a cathode at one end of the ion source chamber; and a repeller formed of silicon carbide diametrically opposed from the cathode, wherein the silicon carbide is a non-stoichiometric sintered material of the formula $SiC_x$, wherein x is in a range from 1.1 to 1.45.

In yet another embodiment, an ion source for an ion implantation system, the ion source comprises an ionization region; and one or surfaces exposed to the ionization region within the ion source, wherein the one or more surfaces comprise silicon carbide, wherein the silicon carbide is a non-stoichiometric sintered material having excess carbon.

The disclosure may be understood more readily by reference to the following detailed description of the various features of the disclosure and the examples included therein.

BRIEF DESCRIPTION OF THE SEVERAL VIEWS OF THE DRAWINGS

Referring now to the figures wherein the like elements are numbered alike.

DETAILED DESCRIPTION

Disclosed herein are ion implantation systems that provide the ion source chamber with improved corrosion resistance. The ion implantation systems generally include replacing one or more of the refractory metal and/or graphite components within the ion source chamber with similarly dimensioned silicon carbide (SiC) components. The silicon carbide suitable for use in the present disclosure is a non-stoichiometric electrically conductive sintered silicon carbide of the formula $SiC_x$, wherein x is the molar ratio of carbon to silicon and contains excess carbon, which may be present as graphite, amorphous carbon or mixtures thereof. In most embodiments, x is greater than 1, generally greater than about 1.1, but less than about 1.45. In some embodiments, the molar ratio of carbon may exceed 1.45, however, in these embodiments, mechanical properties may become a consideration for the particular ion source chamber component. The grain size is generally from 4 to 10 microns in most embodiments.

Suitable non-stoichiometric electrically conductive sintered silicon carbide can be manufactured in accordance with U.S. Pat. No. 5,944,963, incorporated herein by reference in its entirety. Suitable SiC is also commercially available under the trade name Hexoloy® SG from Saint Gobain Ceramics, which is a non-stoichiometric electrically conductive sintered silicon carbide having no free silicon metal.

Advantageously, the use of SiC components within the ion source chamber provides improved corrosion resistance to those components, and also advantageously, the SiC can be configured to provide electrical conductivity suitable for ion implantation, among other properties. By way of comparison, the oxidation rate for SiC is reported to be 0.045 gm/120 hours at 1200° C., which is markedly better than that reported for graphite oxidation (starts at 650° C. and is reported to have an oxidation rate of 0.069 grams per minute (gm/min) at 1000° C.; and tungsten oxidation (oxidation rate reported to be $5E^{-8}$ cm/sec at 1300° C., which translates to about 5 angstroms/second or 1.8 microns per hour in dry oxygen at a pressure of about $10^{-3}$ torr). The electrical resistivity of the SiC is generally less than 10 ohm-cm. In many cases, especially if an amount of excess carbon near the maximum permissible amount is present, or if the density of the target is at or close to the theoretical density of the material, the resistivity will be less, typically no greater than about 2.0 ohm-cm. In still other embodiments, the carbon content of the non-stoichiometric silicon carbide is selected to provide an electrical resistivity of less than 1.0 ohm-cm. The electrical conductivity as described permits DC-magnetron sputtering rates of about half that of aluminum. Compared to other materials, the silicon carbide as described herein also provides excellent thermal conductivity.

In addition to the markedly improved oxidation resistance, the use of silicon carbide reduces the generation of volatile compounds as has been observed when tungsten, tantalum, graphite, molybdenum have been exposed to energetic fluorine or oxygen ions. As noted in the background section, tungsten can form volatile tungsten fluoride, tungsten oxide, and the like, which can be transported to the substrate during an ion implantation process. Likewise, molybdenum fluoride and molybdenum oxide can be formed and subsequently transported to the substrate. Because of the silicon carbide lattice structure with no free silicon, volatile compounds generated upon exposure to ions such as fluorine and oxygen are markedly reduced. The silicon carbide can be in the form of a coating or a monolithic structure in the shape of the component for use in the ion source chamber.

It should be noted that the particular ion implantation system is not intended to be limited so long as the system includes an ion source chamber. For example, suitable ion implantation systems may be high current or medium current systems. High current systems are typically used for low-energy and/or high dose applications, which typically operate at 200 eV to 60 or 80 keV. Medium current systems are used for lower dose applications and have the widest energy range, which is typically about 2 keV to 900 keV.

Figure 1:
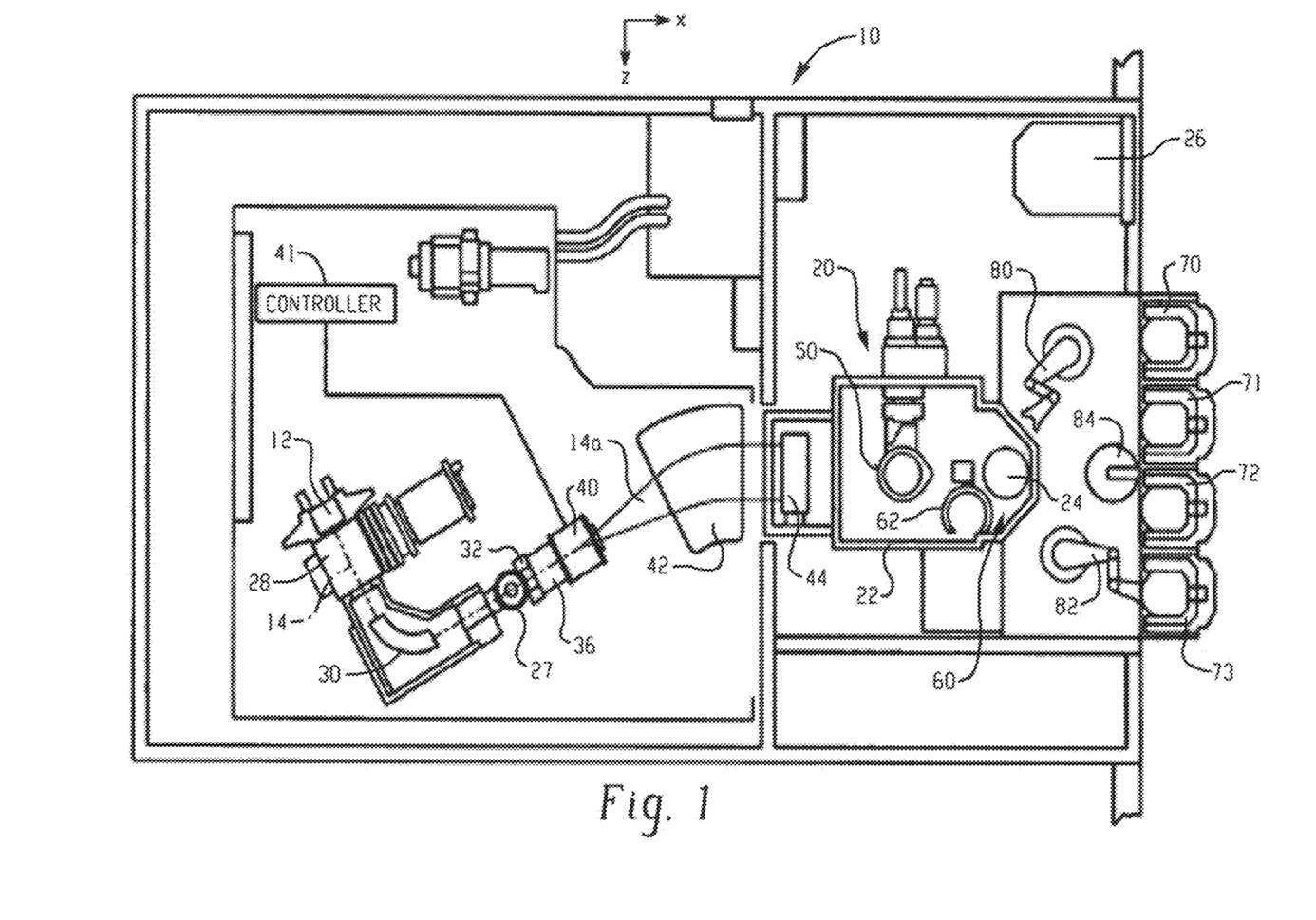
FIG. 1 is schematic view of an ion implantation system for ion beam treatment of a workpiece such as a silicon wafer mounted on a spinning support.

Turning now to the drawings, FIG. 1 illustrates a schematic depiction of an exemplary ion beam implantation system 10. The implanter includes an ion source 12 for creating ions that form an ion beam 14 which is shaped and selectively deflected to traverse a beam path to an end or implantation station 20. The implantation station includes a vacuum or implantation chamber 22 defining an interior region in which a workpiece 24 such as a semiconductor wafer is positioned for implantation by ions that make up the ion beam 14. Control electronics indicated schematically as a controller 41 are provided for monitoring and controlling the ion dosage received by the workpiece 24. Operator input to the control electronics are performed via a user control console 26 located near the end station 20. The ions in the ion beam 14 tend to diverge as the beam traverses a region between the source and the implantation chamber. To reduce this divergence, the region is maintained at low pressure by one or more vacuum pumps 27.

The ion source 12 includes a plasma chamber defining an interior region into which source materials are injected. The source materials may include an ionizable gas or vaporized source material. Ions generated within the plasma chamber are extracted from the chamber by ion beam extraction assembly 28 which includes a number of metallic electrodes for creating an ion accelerating electric field.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam then passes through a deflection magnet 40 which is controlled by the controller 41. The controller 41 provides an alternating current signal to the conductive windings of the magnet 40 which in turn caused the ion beam 14 to repetitively deflect or scan from side to side at a frequency of several hundred Hertz. In one disclosed embodiment, scanning frequencies of from 200 to 300 Hertz are used. This deflection or side to side scanning generates a thin, fan shaped ribbon ion beam 14 a.

Ions within the fan shaped ribbon beam follow diverging paths after they leave the magnet 40. The ions enter a parallelizing magnet 42 wherein the ions that make up the beam 14 a are again bent by varying amounts so that they exit the parallelizing magnet 42 moving along generally parallel beam paths. The ions then enter an energy filter 44 that deflects the ions downward (y-direction in FIG. 1) due to their charge. This removes neutral particles that have entered the beam during the upstream beam shaping that takes place.

The ion beam 14a that exits the parallelizing magnet 42 is an ion beam with a cross-section essentially forming a very narrow rectangle that is, a beam that extends in one direction, e.g., has a vertical extent that is limited (e.g. approx ½ inch) and has an extent in the orthogonal direction that widens outwardly due to the scanning or deflecting caused to the magnet 40 to completely cover a diameter of a workpiece such as a silicon wafer.

Generally, the extent of the ribbon ion beam 14 a is sufficient to, when scanned, implant an entire surface of the workpiece 24. Assume the workpiece 24 has a horizontal dimension of 300 mm. (or a diameter of 300 mm.). The magnet 40 will deflect the beam such that a horizontal extent of the ribbon ion beam 14 a, upon striking the implantation surface of the workpiece 24 within the implantation chamber 22, will be at least 300 mm.

A workpiece support structure 50 both supports and moves the workpiece 24 (up and down in the y direction) with respect to the ribbon ion beam 14 during implantation such that an entire implantation surface of the workpiece 24 is uniformly implanted with ions. Since the implantation chamber interior region is evacuated, workpieces must enter and exit the chamber through a loadlock 60. A robotic arm 62 mounted within the implantation chamber 22 automatically moves wafer workpieces to and from the loadlock 60. A workpiece 24 is shown in a horizontal position within the load lock 60 in FIG. 1. The arm moves the workpiece 24 from the load lock 60 to the support 50 by rotating the workpiece through an arcuate path. Prior to implantation, the workpiece support structure 50 rotates the workpiece 24 to a vertical or near vertical position for implantation. If the workpiece 24 is vertical, that is, normal with respect to the ion beam 14, the implantation angle or angle of incidence between the ion beam and the normal to the workpiece surface is 0 degrees.

In a typical implantation operation, undoped workpieces (typically semiconductor wafers) are retrieved from one of a number of cassettes 70-73 by one of two robots 80, 82 which move a workpiece 24 to an orienter 84, where the workpiece 24 is rotated to a particular orientation. A robot arm retrieves the oriented workpiece 24 and moves it into the load lock 60. The load lock closes and is pumped down to a desired vacuum, and then opens into the implantation chamber 22. The robotic arm 62 grasps the workpiece 24, brings it within the implantation chamber 22 and places it on an electrostatic clamp or chuck of the workpiece support structure 50. The electrostatic clamp is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion beam processing of the workpiece 24, the workpiece support structure 50 returns the workpiece 24 to a horizontal position and the electrostatic clamp is de-energized to release the workpiece. The arm 62 grasps the workpiece 24 after such ion beam treatment and moves it from the support 50 back into the load lock 60. In accordance with an alternate design the load lock has a top and a bottom region that are independently evacuated and pressurized and in this alternate embodiment a second robotic arm (not shown) at the implantation station 20 grasps the implanted workpiece 24 and moves it from the implantation chamber 22 back to the load lock 60. From the load lock 60, a robotic arm of one of the robots moves the implanted workpiece 24 back to one of the cassettes 70-73 and most typically to the cassette from which it was initially withdrawn.

Figure 2:
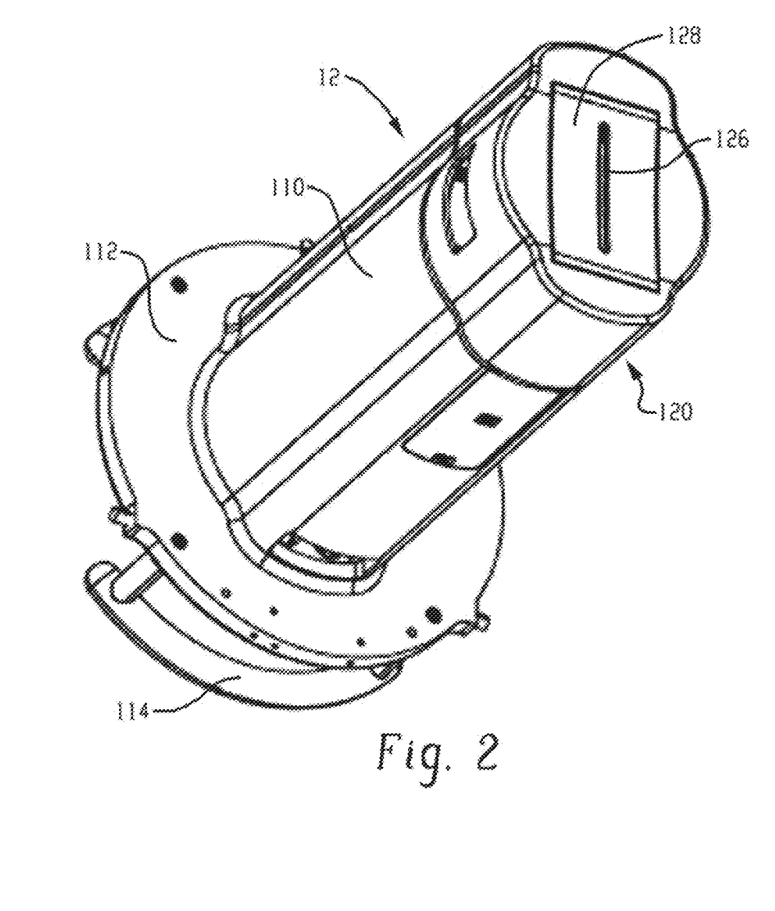
FIG. 2 is a perspective view of an ion source in accordance with the present disclosure.

As shown in FIG. 2, the ion generating source 12 includes a source block 110 supported by a flange 112 having handles 114 by which the source 12 can be removed from the implanter. The source block 110 supports a plasma arc chamber shown generally at 120. The high-density plasma arc chamber 120 has an elongated, generally elliptically shaped exit source aperture 126 in a plate 128 through which ions exit the source. Additional details concerning one prior art ion source are disclosed in U.S. Pat. No. 5,026,997 to Benveniste et al. assigned to the assignee of the present invention and which is incorporated herein by reference. As ions migrate from the arc chamber 120, they are accelerated away from the chamber 120 by electric fields set up by the beam extraction assembly positioned relative to the exit aperture.

An arc ion source is defined in the textbook "Plasma Physics in Theory and Application" Ed. W. Kunkel, MacGraw-Hill, 1966 by noting that "All [electrical] discharges with eVc<E [Vc is cathode voltage drop, E is ionization energy] will be classified as electric arcs regardless of specific conditions at the cathode or in the body of the plasma. [ . . . ] Obviously, in this way the category of arcs is very large, since no restrictions are placed on either gas pressure or current density. In fact, all thermionic diodes must be included here as long as sufficient gas ionization occurs to produce a substantial neutralization of the space charge, so that the term discharge plasma may still be appropriate. Depending on gas density, current density, and the conditions at the cathode, arc discharges can differ greatly in their characteristic properties." This definition is summarized herein by referring to a "hot filament" ion source as one where either electrons of a sufficient energy are emitted from a directly energized filament (which thus acts as a cathode) or wherein electrons from an energized filament bombard a cathode which turn emits electrons of sufficient energy to ionize a gas within an arc chamber.

A source magnet (not shown) encircles the plasma arc chamber 120 to confine the plasma generating electrons to tightly constrained travel paths within the chamber 120. The source block 110 defines cavities that accommodate vaporizer ovens that can be filled with vaporizable solids such as arsenic that are vaporized to a gas and then injected into the plasma chamber by means of delivery nozzles.

Figure 3:
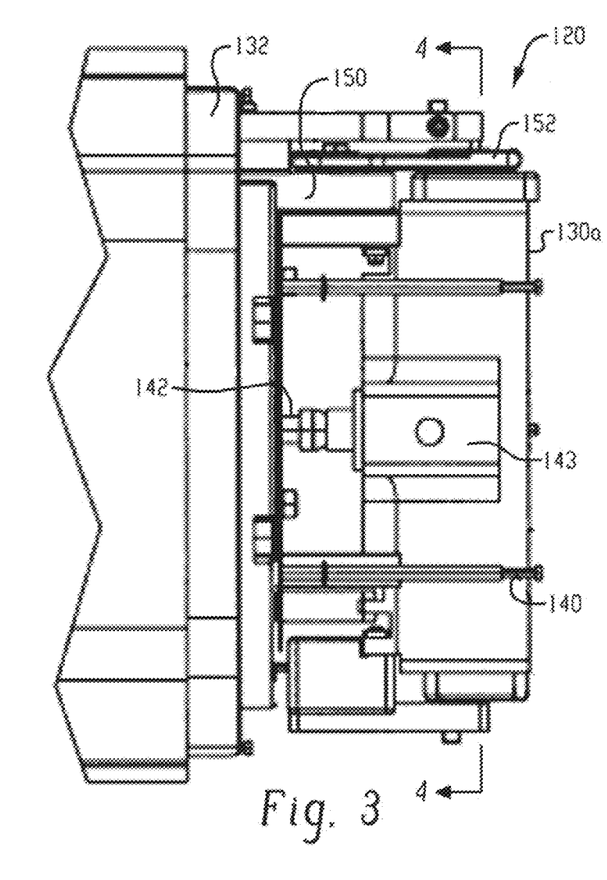
FIG. 3 is a sectional view of an ion source chamber in accordance with the present disclosure.
Figure 4:
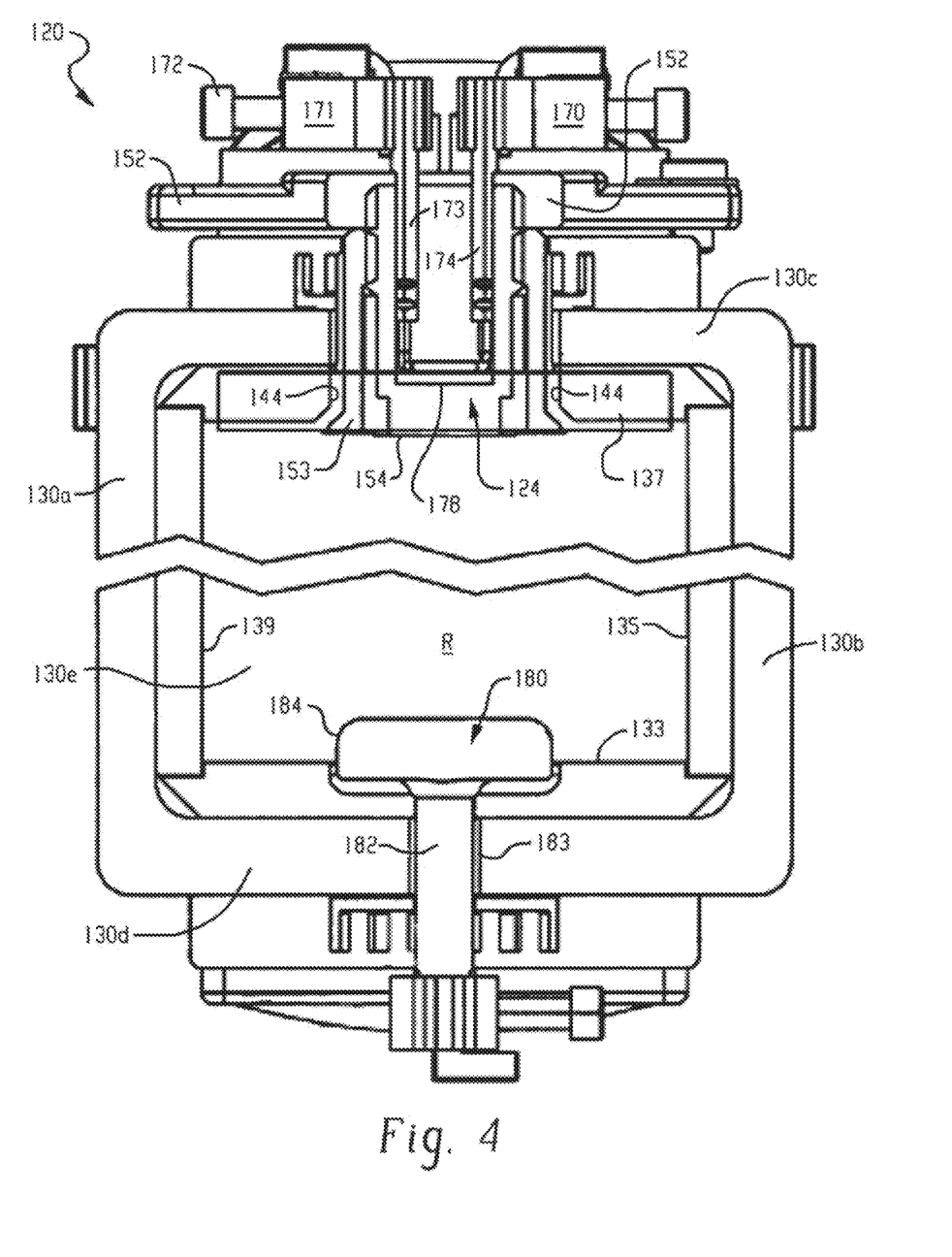
FIG. 4 is a sectional view from the plane defined by line 4-4 in FIG. 3.

As shown more clearly in FIGS. 3 and 4, the plasma arc chamber 120 is an elongated machined refractory metal or graphite block, which defines an interior ionization region R bounded by two elongated side walls 130a, 130b top and bottom walls 130c, 130d, a rear wall 130e, and the front plate 128 that abuts the ionization region R. Interior liner sections 133, 135, 137, 139 of silicon carbide are disposed about the walls. Although not shown, a liner section covers rear wall 130e. The front plate 128 may include a liner having a surface interiorly facing the ionization region R formed of silicon carbide. Alternatively, the front plate itself may be formed of or have a coating of silicon carbide. Still further, the front plate 128 may include an insert defining the source aperture 126 (see FIG. 2), wherein the insert is formed of silicon carbide in accordance with the present disclosure. Extending outwardly near a front of the source block is a support flange 132, which supports the arc chamber 120.

Pins 140 extend through openings at corners of the flange 132 to support the plate 128 and position the exit aperture 126. Springs (not shown) bias the plate into engagement with the arc chamber. Vaporized material is injected into the interior of the plasma arc chamber 120 from the support block 110 by a delivery tube 142 that routes vaporized material into the chamber interior by a gas connection manifold 143 attached to the side of the arc chamber. Alternatively, gas can be directly routed into the arc chamber interior region R by means of a port or opening (not shown) in a rear wall 130e of the chamber. In such an alternate arrangement, a nozzle (not shown) abuts such an opening and injects gas directly into the arc chamber from a source or supply external to the ion source.

End wall 130c and liner 137 defines an opening 144 sized to allow the cathode 124 to extend into an interior of the plasma arc chamber without touching the chamber wall 130c or liner 137 that defines the opening 144. The cathode 124 is supported by an insulating mounting block 150 that is attached to the source block 110 in relation to the end of the arc chamber that supports the cathode 124. A cathode body that fits into the opening 144 is mounted to a graphite metal mounting plate 152 supported by the insulating mounting block 150. The insulating block 150 is typically an elongated ceramic electrically insulating block constructed from 99% pure alumina ($Al_2O_3$).

The cathode body is constructed from three metallic members. An outer tubular member of the cathode 124 is made from a molybdenum alloy material and has a lower end that abuts the mounting plate 152. An inner tubular member is also made from a molybdenum alloy material has a threaded lower end portion that is threaded into a threaded opening in the mounting plate 152. The tubular members are typically cylindrical. An end cap 154 of the cathode 124 is conductive and is typically made from a tungsten material. The cap 154 fits within a counterbore of an end of one of the tubular members. The counterbore has an inwardly extending ridge having an inner diameter slightly smaller than the diameter of the cap 154. During assembly of the cathode 124 the cap is press fit onto the tubular member and frictionally held in place during operation of the ion implanter 10. The length of the inner and outer tubular members is selected so that the end cap 154 extends upward into the arc chamber beyond the end of the outer tubular member.

Two conductive mounting arms 170, 171 support a filament 178 inside the cathode 124. The arms 170, 171 are attached directly to the insulating block 150 by connectors 172 that pass through the arms to engage threaded openings in the block 150. Conductive clamps 173, 174 are coupled to the filament and energized by signals routed through electrical feedthroughs connected to the arms.

Two clamps fix a tungsten filament 178 within a cavity defined by an innermost tubular member of the cathode. The filament 178 is made of a tungsten wire bent to form a helical loop. Ends of the filament 178 are supported by tantalum legs held in electrical contact with the two arms 170, 171 by the clamps 173, 174. A cathode shield 153 annularly surrounds the cathode 124. The cathode shield may be formed of silicon carbide.

When the tungsten wire filament 178 is energized by application of a potential difference across the two arms 170, 171, the filament emits electrons which accelerate toward and impact the cap 154 of the cathode 124. When the cap 154 is sufficiently heated by electron bombardment, it in turn emits electrons into the interior of the arc chamber, which then strike gas molecules and create ions within the arc chamber. An ion plasma is created and ions within this plasma exit the opening 126 to form the ion beam. The cap 154 shields the filament from contact with the ion plasma within the chamber and extends the life of the filament.

Electrons generated by the cathode 124 that are emitted into the arc chamber but which do not engage a gas molecule within a gas ionization zone move to the vicinity of a repeller 180 including a head portion 184 and a stem portion 182. The repeller 180 deflects electrons back into a gas ionization region R to contact a gas molecule. The repeller 180 is typically made from molybdenum or tungsten and is spaced from the wall 130d of the plasma arc chamber 120 by a gap defined by a cylindrical opening 183 having an inner diameter larger than the outer diameter of the repeller stem 182. The cathode 124 and repeller 180 are therefore both electrically isolated from the arc chamber walls. In the present disclosure, the repeller can be formed of silicon carbide.

The walls of the chamber 120 are held at a local ground or reference electric potential. The cathode, including the cathode end cap 154 is held at a potential of between 50-150 volts below the local ground of the chamber walls. This electric potential is coupled to the plate 152 by a power feedthrough for attaching an electrical conductor to the plate 152 that supports the cathode. The filament 178 is typically held at a voltage of between 200 and 600 volts below that of the end cap 154 The large voltage difference between the filament and the cathode imparts a high energy to the electrons leaving the filament that is sufficient to heat the end cap 164 and thermionically emit electrons into the chamber 120 The repeller 180 is at cathode potential due to a strap connecting both assemblies to a common DC power supply, as an option it can be connected to a separate DC power supply and set at an independent voltage level.

In the present disclosure, one or more of the liners defining the interior surfaces of the ion source chamber 120 are formed of silicon carbide. This includes, but is not limited to, at least one or more of the following ion source chamber components: the cathode shield 153, repeller 180, the top, bottom, side and liner sections 133, 135, 137, and 139 respectively, the plate, a liner section shielding the plate, and/or a portion of the plate defining the arc opening 126. With regard to the portion of the plate 128 defining the arc opening 126, a two piece construction may be employed to minimize costs, wherein an insert including the opening 126 is attached to the plate. Although not shown, the liner section covering read facing wall 130e may also be formed of silicon carbide.

In order that the invention may be more readily understood, reference is made to the following examples, which are intended to illustrate the invention, but not limit the scope thereof.

EXAMPLES

In this example, surface metal contamination of a $BF_2$ 14 keV high dose implants was measured in an Optima HDx ion implantation system commercially available from Axcelis Technologies, Inc. having a tungsten repeller and the same ion implantation system wherein the tungsten repeller was replaced with a silicon carbide repeller of the same dimensions. The SiC was Hexoloy SG. Bare wafers with 200 angstroms of thermally grown oxide were implanted with a dose of $5 \times 10^{15}$ ions/cm$^2$ at a beam current of 14 mA. The $BF_2$ ions were generated from $BF_3$. All other test parameters were identical for both the tungsten and silicon carbide repellers. Prior to each sample run, the ion source chamber was exposed to a 30 minute high power argon beam. Surface contamination was measured using vapor phase decomposition inductively coupled plasma mass spectroscopy (VPD ICP-MS). The results are shown in Table 1 below.

TABLE 1

| | REPELLER COMPOSITION | |
|---|---|---|
| | Pure Tungsten | Silicon Carbide |
| SURFACE CONTAMINATION ($\times 10^{10}$ atoms/cm$^2$) | 14.5 | 5.8 |

As shown above, surface contamination was markedly reduced by about 86% by replacing the tungsten repeller in the commercially available ion implantation system with a silicon carbide repeller in accordance with the present disclosure.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An ion source chamber for an ion implantation system, the ion source chamber comprising:
   a housing that at least partially bounds an ionization region through which high energy electrons move from a cathode to ionize gas molecules injected into an interior of the housing;
   a liner section defining one or more interior walls of the housing interior, wherein each liner section includes an interiorly facing surface exposed to the ionization region during operation of the ion implantation system;
   a cathode shield disposed about the cathode, wherein the cathode is free of contact with the liner section and comprises an end cap;
   a repeller spaced apart from the cathode;
   a plate comprising a source aperture for discharging ions from the ion source chamber;

wherein the cathode end cap, or the cathode shield, or an insert in the plate defining the source aperture comprise silicon carbide having a monolithic structure, wherein the silicon carbide is a non-stoichiometric sintered material of the formula $SiC_x$, wherein x is from 1.1 to 1.45.

2. The ion source chamber of claim 1, wherein the source aperture is a slit.

3. The ion source chamber of claim 1, wherein the silicon carbide is a coating.

4. The ion source chamber of claim 1, wherein the non-stoichiometric sintered silicon carbide is configured to provide an electrical resistivity of less than 10 ohm-cm.

5. The ion source chamber of claim 1, wherein the non-stoichiometric sintered silicon carbide is configured to provide an electrical resistivity of less than 2.0 ohm-cm.

6. The ion source chamber of claim 1, wherein the non-stoichiometric sintered silicon carbide is configured to provide an electrical resistivity of less than 1.0 ohm-cm.

7. The ion source chamber of claim 1, wherein the non-stoichiometric sintered silicon carbide has a grain size of 4 microns to 10 microns.

8. The ion source chamber of claim 1, wherein the source aperture is elliptically shaped.

9. An ion source for an ion implantation system, the ion source comprising:
an ionization region; and
one or more surfaces exposed to the ionization region within the ion source, wherein the one or more surfaces comprise silicon carbide having a monolithic structure, wherein the one or more surfaces are components of the ion source selected from the group consisting of a cathode end cap, a cathode shield, an insert in the plate defining the source chamber, and combinations thereof, wherein the silicon carbide is a non-stoichiometric sintered material having excess carbon of the formula $SiC_x$, and wherein x is from 1.1 to 1.45, and contains 0.3 to 3 weight percent boron.

* * * * *